(12) United States Patent
Li et al.

(10) Patent No.: US 11,861,119 B2
(45) Date of Patent: Jan. 2, 2024

(54) DISPLAY PANEL AND METHOD FOR MANUFACTURING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zewen Li, Beijing (CN); KwangGyun Jang, Beijing (CN); Hongqiang Luo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 157 days.

(21) Appl. No.: 17/429,927

(22) PCT Filed: Oct. 27, 2020

(86) PCT No.: PCT/CN2020/124080
§ 371 (c)(1),
(2) Date: Aug. 10, 2021

(87) PCT Pub. No.: WO2022/087840
PCT Pub. Date: May 5, 2022

(65) Prior Publication Data
US 2022/0269375 A1 Aug. 25, 2022

(51) Int. Cl.
*G06F 3/044* (2006.01)
*G06F 3/041* (2006.01)
(52) U.S. Cl.
CPC .......... *G06F 3/0446* (2019.05); *G06F 3/0412* (2013.01)

(58) Field of Classification Search
CPC .............................. G06F 3/0446; G06F 3/0412
See application file for complete search history.

(56) References Cited

U.S. PATENT DOCUMENTS 11,687,193 B2 * 6/2023 Fang ................. G06F 3/041661
345/173
2019/0393278 A1 12/2019 Wu
(Continued)

FOREIGN PATENT DOCUMENTS

| CN | 104955270 A | 9/2015 |
| CN | 104968139 A | 10/2015 |

(Continued)

OTHER PUBLICATIONS

Machine Translation of CN 109087586 B (Year: 2021).*

*Primary Examiner* — Peter D McLoone
(74) *Attorney, Agent, or Firm* — IP & T GROUP LLP

(57) ABSTRACT

A display panel has a display area and a frame area located on a side of the display area, and the frame area includes a bonding region. The display panel includes: a display substrate, a touch structure disposed on the display substrate, and a protective layer disposed on a side of the touch structure away from the display substrate. The touch structure includes a plurality of conductive pins located in the bonding region. The protective layer has an opening, the opening is located in the bonding region and serves to expose the plurality of conductive pins. The opening includes a border proximate to the display area and extending in a direction in which the plurality of conductive pins are arranged, and at least portion of the border has a curved shape.

17 Claims, 11 Drawing Sheets

(56) References Cited

U.S. PATENT DOCUMENTS

2020/0210041 A1  7/2020 Liu
2022/0164103 A1* 5/2022 Fang .................... G06F 3/0412

FOREIGN PATENT DOCUMENTS

| CN | 205232566 U |   | 5/2016  |          |           |
|----|-------------|---|---------|----------|-----------|
| CN | 206620356 U |   | 11/2017 |          |           |
| CN | 109087586 A |   | 12/2018 |          |           |
| CN | 109445649 A |   | 3/2019  |          |           |
| CN | 109087586 B | * | 5/2021  | ............ | G09F 9/301 |

* cited by examiner

DISPLAY PANEL AND METHOD FOR MANUFACTURING THE SAME, AND DISPLAY APPARATUS

CROSS-REFERENCE TO RELATED APPLICATION

This application is a national phase entry under 35 USC 371 of International Patent Application No. PCT/CN2020/124080 filed on Oct. 27, 2020, which is incorporated herein by reference in its entirety.

TECHNICAL FIELD

The present disclosure relates to the field of display technologies, and in particular, to a display panel and a method for manufacturing the same, and a display apparatus.

BACKGROUND

With the development of economic life, touch display panels have been widely accepted and used by people. The touch display panel combines a touch structure and a display substrate into a whole, so that the touch display panel equipped with the touch structure has a display function and a sensing touch function simultaneously. For example, the touch display panels are used in smart phones, tablet computers and so on.

SUMMARY

In one aspect, a display panel is provided. The display panel has a display area and a frame area located on a side of the display area, and the frame area includes a bonding region. The display panel includes: a display substrate, a touch structure disposed on the display substrate, and a protective layer disposed on a side of the touch structure away from the display substrate. The touch structure includes a plurality of conductive pins located in the bonding region. The protective layer has an opening, the opening is located in the bonding region and serves to expose the plurality of conductive pins. The opening includes a border proximate to the display area and extending in a direction in which the plurality of conductive pins are arranged, and at least portion of the border has a curved shape.

In some embodiments, the at least portion of the border includes a plurality of first sub-borders, each first sub-border located between respective two adjacent conductive pins and having a curved shape.

In some embodiments, a center of curvature of the first sub-border is located on a side of the border proximate to the display area.

In some embodiments, the first sub-border has approximately same curvature.

In some embodiments, the curved shape of the first sub-border is a circular arc shape.

In some embodiments, in the direction in which the plurality of conductive pins are arranged, a ratio of a dimension of each conductive pin to a radius of the first sub-border is within a range of 1 to 4.67.

In some embodiments, a radius of the first sub-border is within a range of 0.032 mm to 0.075 mm.

In some embodiments, the border further includes a plurality of second sub-borders, each second sub-border overlapping with a respective one of the plurality of conductive pins and having a straight-line shape.

In some embodiments, lengths of the second sub-borders are approximately equal.

In some embodiments, the first sub-borders and the second sub-borders are alternately arranged and connected in series.

In some embodiments, the first sub-borders and the second sub-borders are alternately arranged. The at least portion of the border further includes a plurality of third sub-borders, each third sub-border connecting a respective first sub-border and a second sub-border that are adjacent. The third sub-border has a curved shape, and a center of curvature of the third sub-border is located on a side of the border away from the display area.

In some embodiments, the curved shape of the third sub-border is a circular arc shape.

In some embodiments, a radius of the third sub-border is within a range of 0.025 mm to 0.05 mm.

In some embodiments, the plurality of conductive pins include a plurality of first sub-conductive pins and a plurality of second sub-conductive pins. The touch structure further includes: a plurality of first touch units located in the display area and extending in a first direction, a plurality of second touch units located in the display area and extending in a second direction intersecting with the first direction, and a plurality of touch signal lines located in the frame area. The plurality of touch signal lines include a plurality of first sub-touch signal lines and a plurality of second sub-touch signal lines. The plurality of first touch units are electrically connected with the plurality of first sub-conductive pins through the plurality of first sub-touch signal lines, and the plurality of second touch units are electrically connected with the plurality of second sub-conductive pins through the plurality of second sub-touch signal lines.

In some embodiments, the display panel further includes: a base disposed on a side of the touch structure proximate to the display substrate, and a connection layer connecting the display substrate and the base.

In another aspect, a display apparatus is provided. The display apparatus includes: the display panel as described in any one of the above embodiments, and a flexible circuit board bonded with the plurality of conductive pins of the display panel.

In some embodiments, the flexible circuit board includes a plurality of gold fingers bonded to the plurality of conductive pins. A minimum distance between a border of the plurality of gold fingers parallel to a direction in which the plurality of gold fingers are arranged and proximate to the display area of the display panel and the border of the opening of the protective layer of the display panel is within a range of 0 mm to 0.30 mm.

In yet another aspect, a method for manufacturing a display panel is provided. The method for manufacturing the display panel includes: providing a display substrate, the display substrate having a display area and a frame area located on a side of the display area, and the frame area including a bonding region; forming a touch structure on the display substrate, the touch structure including a plurality of conductive pins located in the bonding region; forming a protective film on a side of the touch structure away from the display substrate; and patterning the protective film to form a protective layer. The protective layer has an opening, the opening is located in the bonding region and serves to expose the plurality of conductive pins, and the opening includes a border proximate to the display area and extending in a direction in which the plurality of conductive pins are arranged, and at least portion of the border has a curved shape.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description can be regarded as schematic diagrams, and are not limitations on actual sizes of products, and actual processes of methods to which the embodiments of the present disclosure relate.

DETAILED DESCRIPTION

Figure 1:
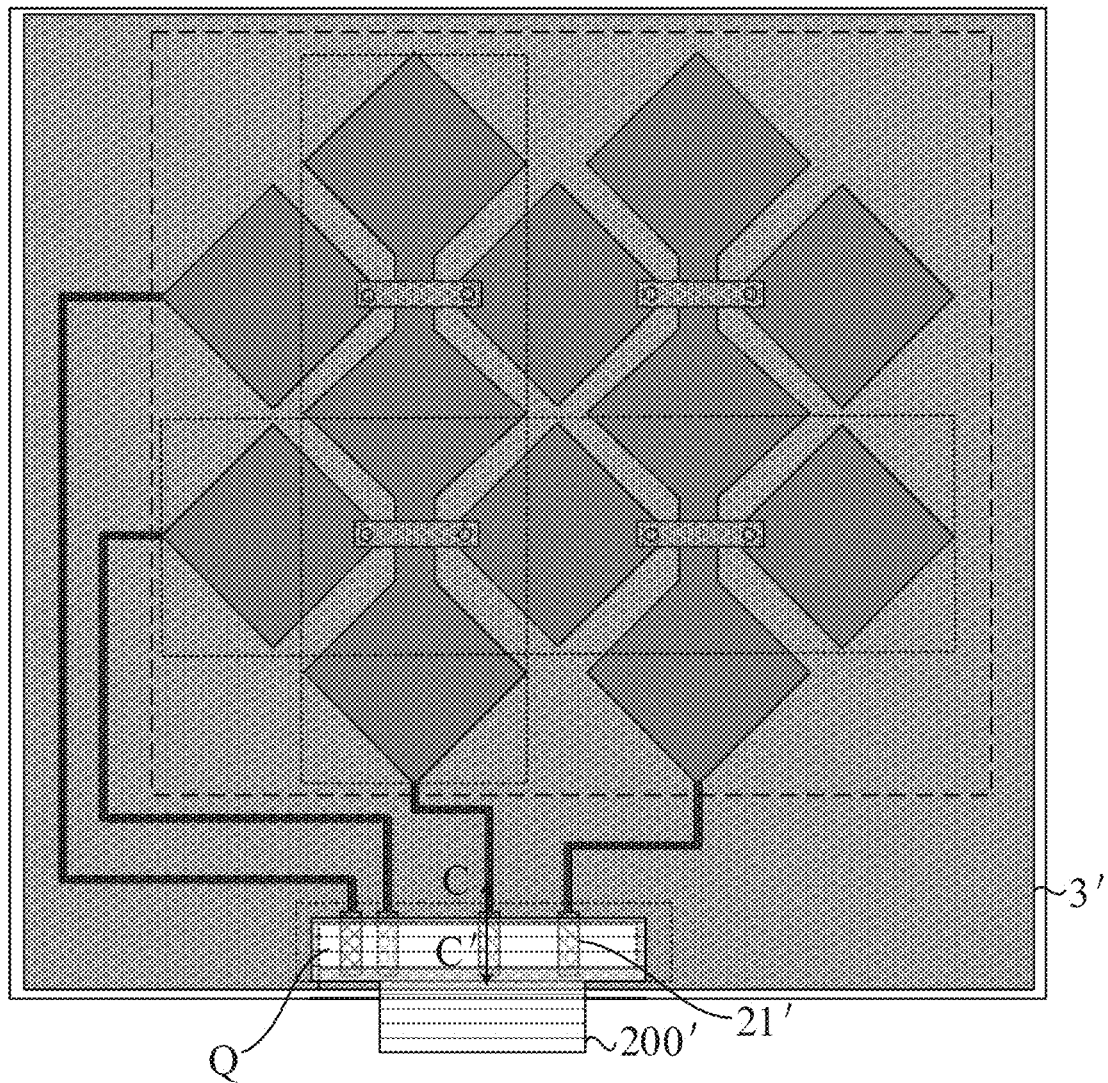
FIG. 1 is a structural diagram of a touch display panel, in accordance with one implementation manner.

The technical solutions in some embodiments of the present disclosure will be described clearly and completely below with reference to accompanying drawings. Obviously, the described embodiments are merely some but not all of embodiments of the present disclosure. All other embodiments obtained on a basis of the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as being open and inclusive, meaning "including, but not limited to," In the description of the specification, the terms "one embodiment", "some embodiments", "exemplary embodiments", "an example", "a specific example" or "some examples" and the like are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

As following, the terms "first" and "second" are only used for descriptive purposes, and are not to be construed as indicating or implying the relative importance or implicitly indicating the number of indicated technical features. Thus, features defined as "first", "second" may explicitly or implicitly include one or more of the features. In the description of the embodiments of the present disclosure, "a plurality of/the plurality of" means two or more unless otherwise specified.

In the description of some embodiments, the term such as "connected" and its derivative extensions may be used. For example, the term "connected" may be used in the description of some embodiments to indicate that two or more components are in direct physical contact or electrical contact with each other. The embodiments disclosed herein are not necessarily limited to the contents herein.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, the phrase "if it is determined" or "if [a stated condition or event] is detected" is optionally construed as "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term such as "about" or "approximately" as used herein includes a stated value and an average value within an acceptable range of deviation of a particular value. The acceptable range of deviation is determined by a person of ordinary skill in the art in view of the measurement in question and error associated with measurement of a particular quantity (i.e., limitations of a measurement system).

Exemplary embodiments are described herein with reference to cross-sectional views and/or plan views as idealized exemplary drawings. In the accompanying drawings, thickness of layers and regions may be exaggerated for clarity. Therefore, variations in shapes with respect to the drawings due to, for example, manufacturing techniques and/or tolerances are conceivable. Therefore, the exemplary embodiments should not be construed as being limited to the shapes of the regions shown herein, but includes shape deviations due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

A touch structure in a touch display panel is usually bonded to a touch flexible circuit board, so as to drive the touch structure and sense a touch position by using the flexible circuit board.

Figure 2:
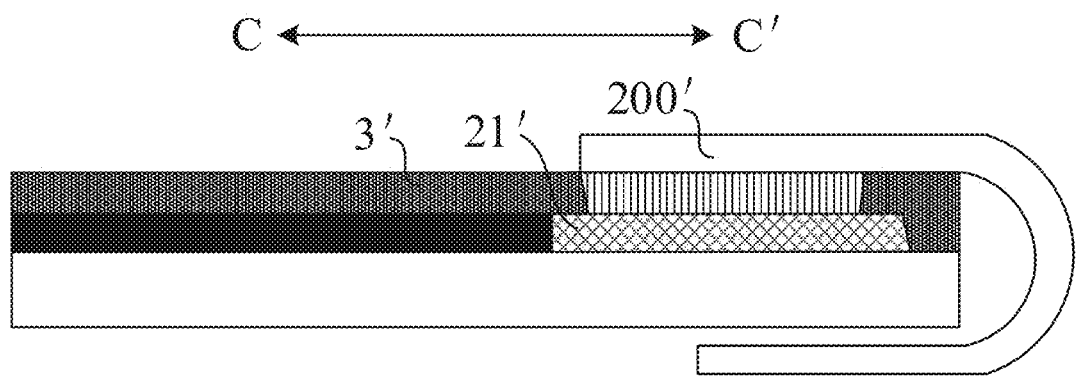
FIG. 2 is a sectional view of the touch display panel shown in FIG. 1 taken along the C-C' direction.

In one implementation manner, as shown in FIGS. 1 and 2, the touch structure includes a plurality of conductive pins 21'. The touch display panel includes a protective layer 3' disposed on a side of the touch structure. The protective layer 3" has an opening for exposing the plurality of conductive pins 21', so that the touch flexible circuit board 200' can be bonded to the plurality of conductive pins of the touch structure through the opening.

Here, the opening Q usually has a relatively regular shape (e.g., a rectangle as shown in FIG. 1), which may reduce a difficulty of manufacturing and forming the opening, and improve a yield of producing the touch display panel.

Figure 3:
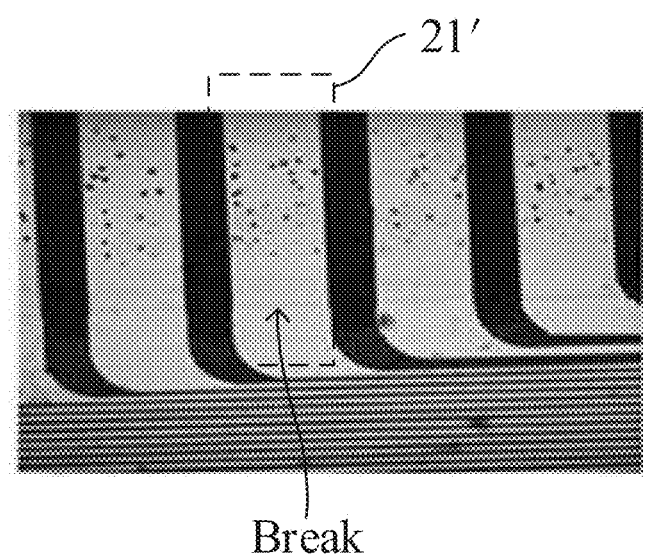
FIG. 3 is an optical microscope (OM) image of a plurality of conductive pins in the touch display panel shown in FIG. 1.
Figure 4:
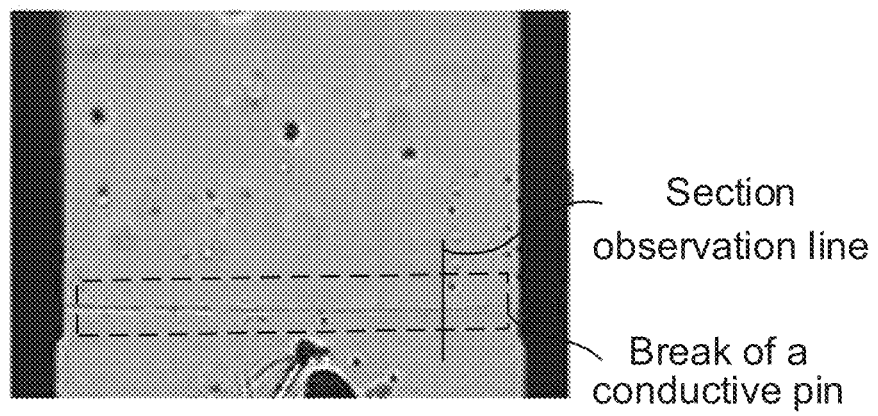
FIG. 4 is an OM image of one conductive pin among the plurality of conductive pins shown in FIG. 3.
Figure 5:
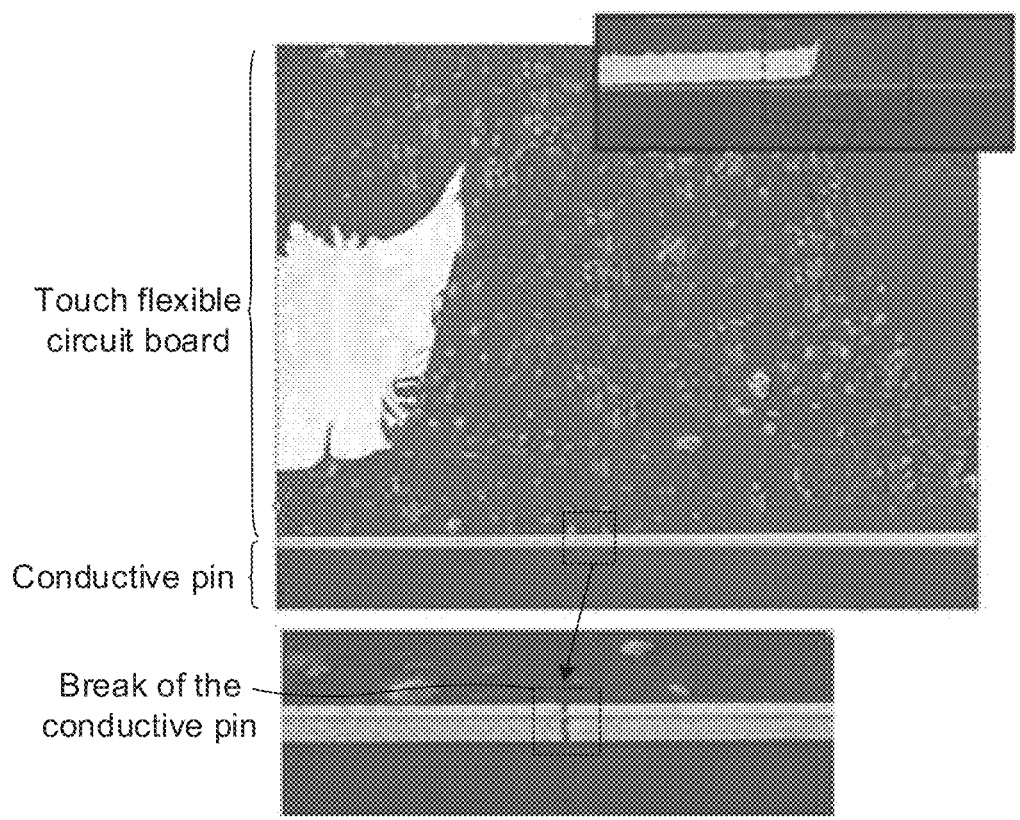
FIG. 5 is a scanning electron microscope (SEM) image of a slice section of the conductive pin shown in FIG. 4.

With the development of a narrow bezel design of the touch display panel, in a process of bonding the touch flexible circuit board 200' and the plurality of conductive pins 21', a phenomenon of stress concentration is prone to occur at positions of the plurality of conductive pins 21' corresponding to an edge of the touch flexible circuit board 200' (e.g., an edge corresponding to the conductive pins 21' in FIG. 2). Moreover, in a process of bending the touch flexible circuit board 200', the stress concentration phenomenon may be worse, so that some of the conductive pins 21' are broken (as shown in FIGS. 3 to 5), resulting in a failure of a sensing touch function of the touch display panel. In addition, in a process of performing a high and low temperature shock environment test (e.g., the test conditions are that: the temperature is within a range of −40° C. to 80° C., the number of cycles is 100 times, and the time is 100 hours) on the touch display panel, more conductive pins 21' will be broken.

Figure 8:
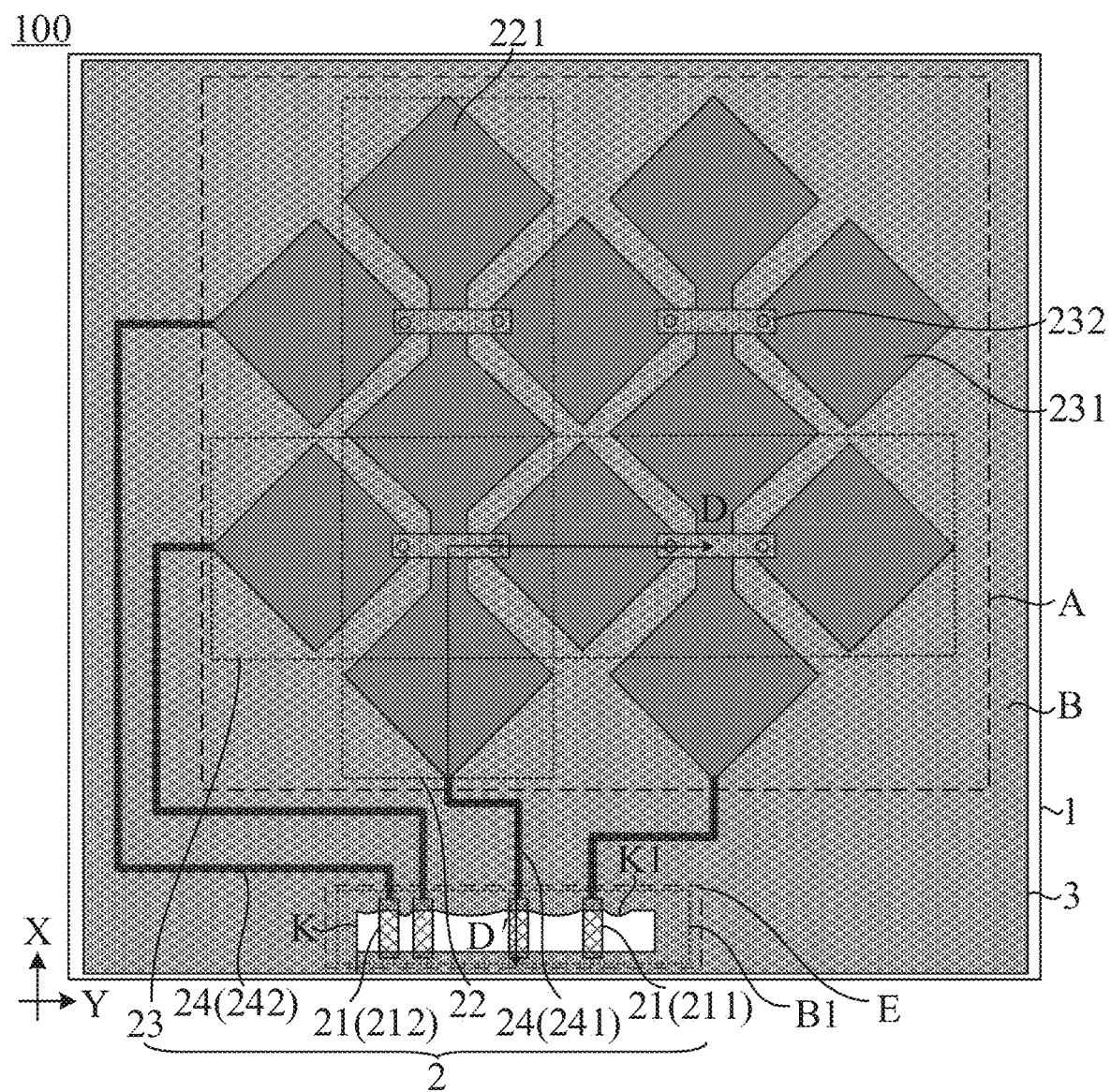
FIG. 8 is a structural diagram of a display panel, in accordance with some embodiments of the present disclosure.

On this basis, some embodiments of the present disclosure provide a display panel 100. As shown in FIG. 8, the display panel 100 has a display area A and a frame area B located on a side of the display area.

Here, "a side" refers to one side, two sides, or all sides of the display area A (as shown in FIG. 8), etc. This means that, the frame area B may be located on one side or two sides of the display area A, or the frame area B may also be disposed around the display area A.

In some examples, as shown in FIG. 8, the frame area B includes a bonding region B1. There may be one or more bonding regions B1. Some embodiments of the present disclosure are schematically described by taking an example in which there is one bonding region B1.

Figure 9:
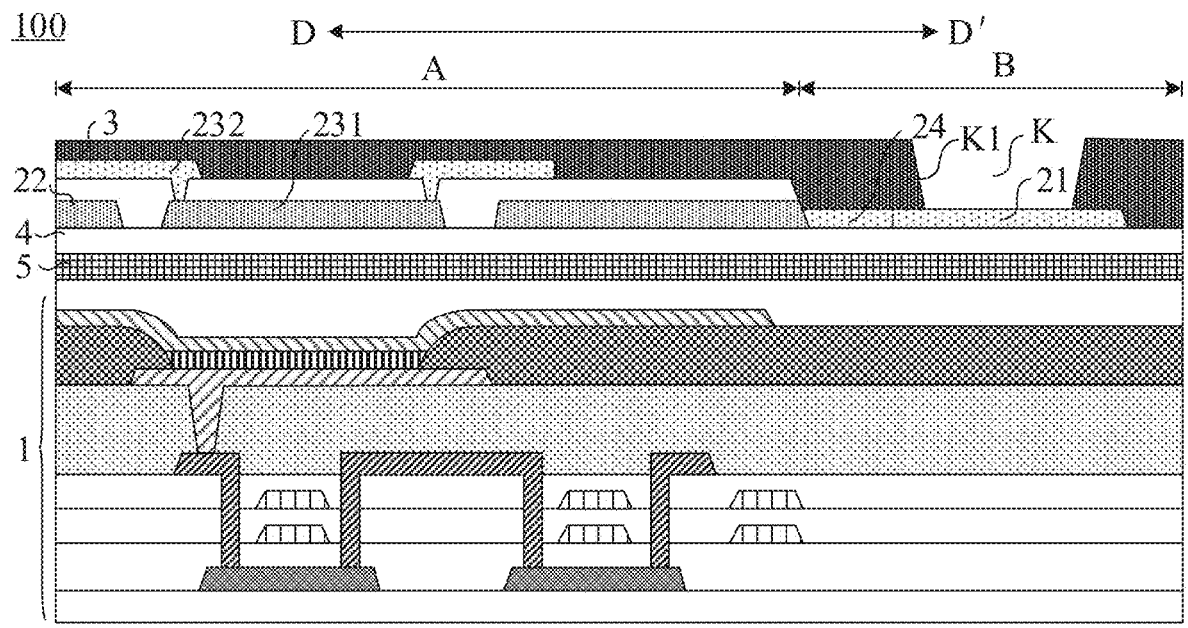
FIG. 9 is a sectional view of the display panel shown in FIG. 8 taken along the D-D' direction.
Figure 10:
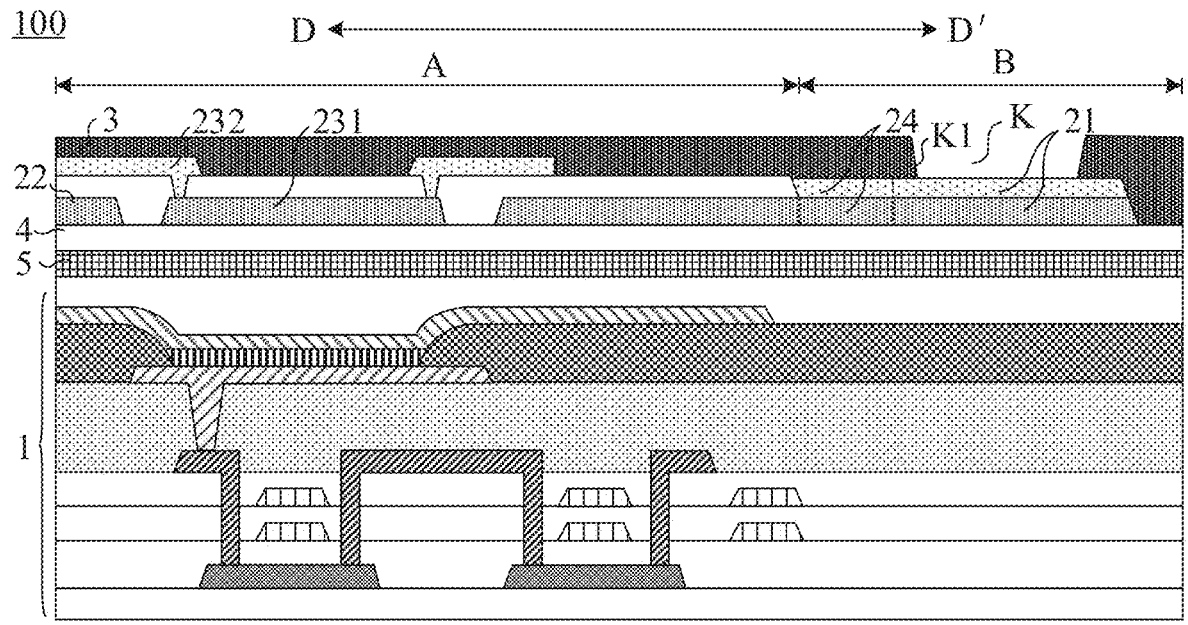
FIG. 10 is another sectional view of the display panel shown in FIG. 8 taken along the D-D' direction.

In some embodiments, as shown in FIGS. 8 to 10, the display panel 100 includes a display substrate 1.

Figure 6:
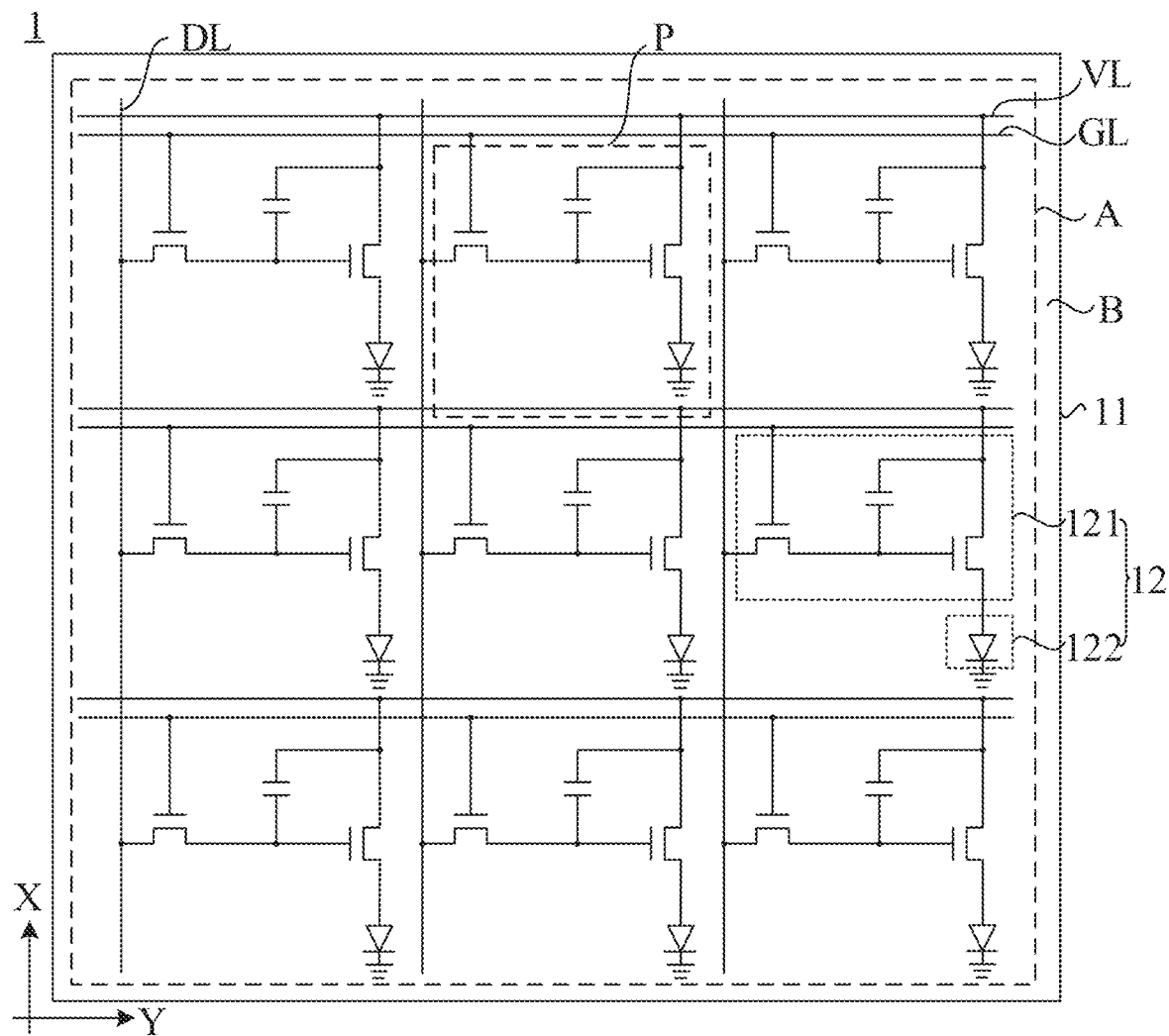
FIG. 6 is a structural diagram of a display substrate, in accordance with some embodiments of the present disclosure.
Figure 7:
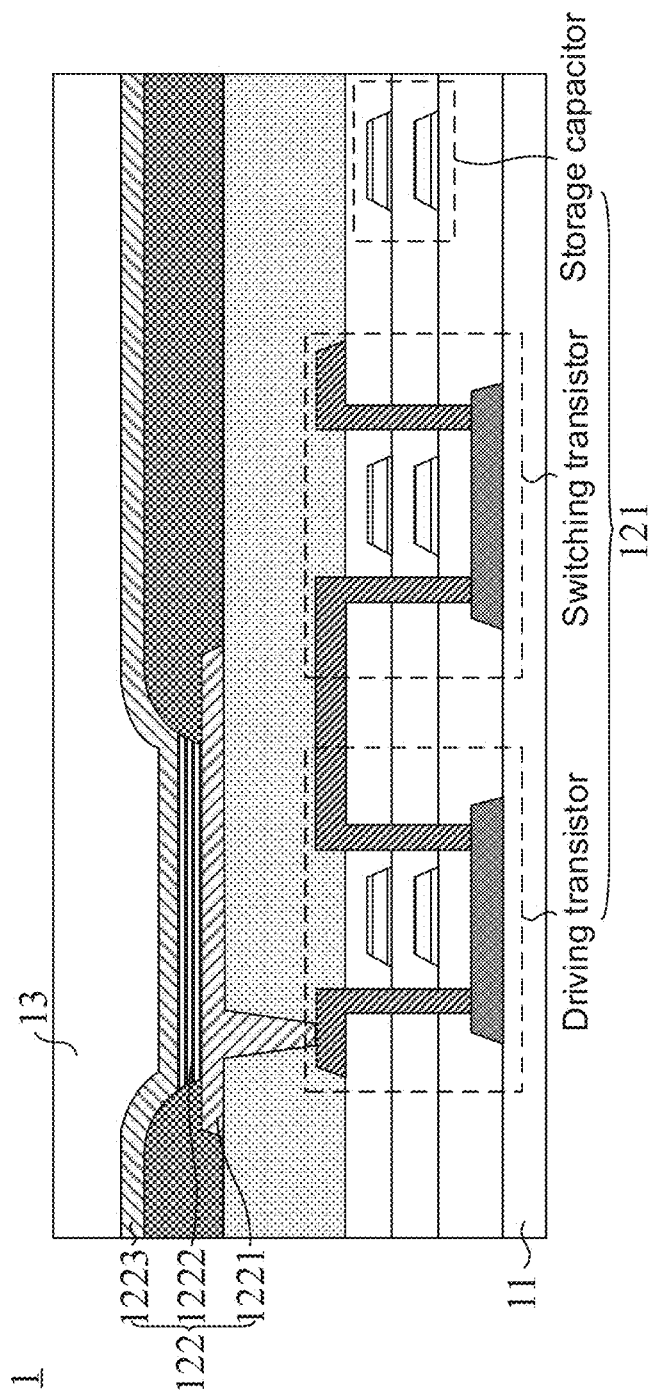
FIG. 7 is a structural diagram of another display substrate, in accordance with some embodiments of the present disclosure.

In some examples, as shown in FIGS. 6 and 7, the display substrate 1 may include a base 11.

The base 11 may be of various types, which may be selected and set according to actual needs.

For example, the base 11 may be a rigid base. The rigid base may be a glass base or a polymethyl methacrylate (PMMA) base, etc.

For example, the base 11 may be a flexible base. The flexible base may be a polyethylene terephthalate (PET) base, a polyethylene naphthalate (PEN) base or a polyimide (PI) base, etc.

In some examples, as shown in FIG. 6, the display substrate 1 may further include: a plurality of gate lines GL and a plurality of data lines DL that are disposed on a side of the base 11 and located in the display area A.

For example, the plurality of data lines DL extend in a first direction X, and the plurality of gate lines GL extend in a second direction Y. The plurality of data lines DL are located on a side of the plurality of gate lines GL away from the base 11, and the plurality of data lines DL are insulated with the plurality of gate lines GL.

For example, as shown in FIG. 6, the first direction X and the second direction Y intersect each other. This means that, the plurality of gate lines GL and the plurality of data lines DL are arranged to intersect each other, so that the plurality of gate lines GL and the plurality of data lines DL may serve to define a plurality of sub-pixel regions P.

Here, an included angle between the first direction X and the second direction Y may be selected and set according to actual needs. For example, the included angle between the first direction X and the second direction Y is 90° or approximately 90°. That is, the plurality of gate lines GL are perpendicular with or approximately perpendicular with the plurality of data lines DL.

In some examples, as shown in FIG. 6, the display substrate 1 may further include: a plurality of sub-pixels 12 disposed in the plurality of sub-pixel regions P. For example, the plurality of sub-pixels 12 and the plurality of sub-pixel regions P are arranged in one-to-one correspondence.

The sub-pixel 12 may be of various structures, which may be selected and set according to actual needs.

For example, as shown in FIG. 6, each sub-pixel 12 may include a pixel driving circuit 121 and a light-emitting device 122 electrically connected to the pixel driving circuit 121. The pixel driving circuit 121 is configured to provide a driving voltage to the light-emitting device 122 electrically connected thereto, so as to control a light-emitting state of the light-emitting device 122.

For example, as shown in FIG. 6, sub-pixel regions P arranged in a line in the second direction Y may be referred to as a same row of sub-pixel regions P, and sub-pixel regions P arranged in a line in the first direction X may be referred to as a same column of sub-pixel regions P. Pixel driving circuits 121 of the same row of sub-pixel regions P may be electrically connected to one gate line GL, and pixel driving circuits 121 of the same column of sub-pixel regions P may be electrically connected to one data line DL. The gate line GL may provide a scan signal to the same row of pixel driving circuits 121 electrically connected thereto, and the data line DL may provide data signals to the same column of pixel driving circuits 121 electrically connected thereto.

Of course, the pixel driving circuits 121 of the same row of sub-pixel regions P may also be electrically connected to multiple gate lines GL, which is not limited in the embodiments of the present disclosure.

In some examples, as shown in FIG. 6, the display substrate 1 may further include a plurality of power supply lines VL disposed on a side of the base 11 and extending in second direction Y, The pixel driving circuits 121 of the same row of sub-pixel regions P may be electrically connected to one power supply line VL. The power supply line VL may provide a voltage signal to the same row of pixel driving circuits 121 electrically connected thereto.

The pixel driving circuit 121 may be of various structures, which may be selected and set according to actual needs. For example, the pixel driving circuit 121 may be of "2T1C", "6T1C", "7T1C", "6T2C" or "7T2C" structure. Here, "T" represents a thin film transistor, and the number before "T" represents the number of thin film transistors; "C" represents a storage capacitor, and the number before "C" represents the number of storage capacitors. As shown in FIG. 6, a plurality of thin film transistors included in the pixel driving circuit 121 include one driving transistor and one switching transistor.

The light-emitting device 122 may be of various structures, which may be selected and set according to actual needs.

For example, as shown in FIG. 7, the light-emitting device 122 includes an anode layer 1221 disposed on a side of the pixel driving circuit 121 away from the base 11 and electrically connected to the driving transistor in the pixel driving circuit 121, and a light-emitting layer 1222 and a cathode layer 1223 that are sequentially stacked on a side of the anode layer 1221 away from the base 11.

For example, the light-emitting device 122 may further include a hole injection layer and/or a hole transport layer disposed between the anode layer 1221 and the light-emitting layer 1222. The light-emitting device 122 may further include an electron transport layer and/or an electron injection layer disposed between the light-emitting layer 1222 and the cathode layer 1223.

The light-emitting layer 1222 may be of various structures. For example, the light-emitting layer 1222 may be an organic light-emitting layer. In this case, the light-emitting device 122 may be referred to as an organic light-emitting diode (OLED), and the display substrate 1 may be referred to as an OLED display substrate. For another example, the light-emitting layer 1222 may be an inorganic light-emitting layer. In this case, the light-emitting device 122 may be referred to as a quantum dot light-emitting diode (QLED), and the display substrate 1 may be referred to as a QLED display substrate.

Here, a plurality of light-emitting devices 122 in the plurality of sub-pixels 12 may emit light of various colors. The light of various colors may cooperate with each other to achieve display of pictures, thereby enabling the display substrate 1 to have a display function.

In some examples, as shown in FIG. 7, the display substrate 1 may further include an encapsulation layer 13 disposed on a side of the sub-pixel 12 away from the base 11. The encapsulation layer 13 is located in both the display area A and the frame area B, and covers the plurality of sub-pixels 12. In this way, the encapsulation layer 13 may serve to form a good encapsulation effect on the sub-pixels 12 to prevent external water vapor and/or oxygen from corroding the light-emitting devices 122 in the sub-pixels 12 and affecting the luminous efficiency and service life of the light-emitting devices 122.

In some embodiments, as shown in FIG. 8, the display panel 100 further includes a touch structure 2 disposed on the display substrate 1.

It will be noted that the plurality of light-emitting devices 122 may be top-emission-type light-emitting devices. In this case, the light emitted by the plurality of light-emitting devices 122 may exit toward a direction facing away from the base 11. The plurality of light-emitting devices 122 may also be bottom-emission-type light-emitting devices. In this case, the light emitted by the plurality of light-emitting devices 122 may exit after passing through the base 11.

Some embodiments of the present disclosure are schematically described by taking an example in which the plurality of light-emitting devices 122 are top-emission-type light-emitting devices. In this case, the touch structure 2 may be disposed on a side of the encapsulation layer 13 away from the base 11. That is, the touch structure 2 may be located on a light-exit side of the display substrate 1.

Of course, in a case where the display substrate 1 is a double-sided light-emitting substrate, the touch structure 2 may be disposed on only one light-exit side of the display substrate 1, or two light-exit sides of the display substrate 1 each may be provided with the touch structure 2.

In some examples, as shown in FIG. 8, the touch structure 2 includes a plurality of conductive pins 21 located in the bonding region B1.

For example, as shown in FIG. 8, each conductive pin 21 may have a strip shape. That is, a shape of an orthogonal projection of the conductive pin 21 on the base 11 may be a rectangle, and a dimension of the rectangle in the first direction X is greater or much greater than a dimension of the rectangle in the second direction Y. In this way, it is beneficial to reduce a dimension of the bonding region B1 in the second direction Y.

For example, the plurality of conductive pins 21 are arranged at intervals in the second direction Y. In this way, every two adjacent conductive pins 21 may be insulated from each other to avoid short-circuiting between two adjacent conductive pins 21.

A distance between every two adjacent conductive pins 21 may be, for example, same or approximately same. That is, the plurality of conductive pins 21 are arranged uniformly spaced apart. In this way, it is beneficial to simplify a wiring design of signal lines in the display panel 100.

In some examples, as shown in FIG. 8, the touch structure 2 may further include: a plurality of first touch units 22 extending in the first direction X and a plurality of second touch units 23 extending in the second direction Y that are located in the display area A, and a plurality of touch signal lines 24 located in the frame area B.

For example, as shown in FIG. 8, the plurality of conductive pins 21 include a plurality of first sub-conductive pins 211 and a plurality of second sub-conductive pins 212. The plurality of touch signal lines 24 include a plurality of first sub-touch signal lines 241 and a plurality of second sub-touch signal lines 242. The plurality of first touch units 22 are electrically connected to the plurality of first sub-conductive pins 211 through the plurality of first sub-touch signal lines 241, and the plurality of second touch units 23 are electrically connected to the plurality of second sub-conductive pins 212 through the plurality of second sub-touch signal lines 242.

In this way, in a case where the display panel 100 is applied into a touch display apparatus and the plurality of conductive pins 21 of the touch structure 2 are bonded to the touch flexible circuit board, the touch flexible circuit board and the touch structure 2 may serve to achieve the sensing touch function.

For example, a process of the sensing touch is schematically described by taking an example in which the first touch unit 22 is a driving channel (Tx) and the second touch unit 23 is a sensing channel (Rx). The touch flexible circuit board may transmit a driving signal to the first touch unit 22 through the first sub-conductive pin 211 and the first sub-touch signal line 241 in sequence, and the second touch unit 23 may feed back an attenuated electrical signal (e.g., capacitance signal) to the touch flexible circuit board through the second sub-touch signal line 242 and the second sub-conductive pin 212 in sequence. In a case where a touch object (e.g., finger) touches the display apparatus, a capacitance value of a coupling capacitor formed at an intersection of the first touch unit 22 and the second touch unit 23 will change. The touch flexible circuit board may determine a touch position of the finger according to a change amount of the capacitance signal by receiving the capacitance signal, thereby achieving the sensing touch function.

The structure of the touch structure 2 will be schematically described below in conjunction with the accompanying drawings.

For example, as shown in FIG. 8, each first touch unit 22 may include a plurality of first touch electrodes 221, and the plurality of first touch electrodes 221 are sequentially connected in series to form an integrated structure.

For example, as shown in FIG. 8, each second touch unit 23 may include a plurality of second touch electrodes 231 arranged at intervals in the second direction Y, and a plurality of conductive bridges 232. Every two adjacent second touch electrodes 231 are electrically connected through one conductive bridge 231. The conductive bridge 232 may be, for example, disposed on a side of the second touch electrode 231 away from the base 11.

Here, as shown in FIGS. 8 to 10, the plurality of first touch units 22 and the plurality of second touch electrodes 231 in each second touch unit 23 may, for example, have a same material and be disposed in a same layer.

It will be noted that, the "same layer" mentioned herein refers to a layer structure formed by a film layer for forming specific patterns by a same film forming process and then by one patterning process using a same mask. Depending on the different specific patterns, the same patterning process may include several exposure, development or etching processes, and the specific patterns in the layer structure formed may be continuous or discontinuous, and these specific patterns may also be at different heights or have different thicknesses. In this way, the plurality of first touch units 22 and the plurality of second touch electrodes 231 in each second touch unit 23 may be manufactured simultaneously in one patterning process, which is beneficial to simplify the manufacturing process of display panel 100.

The "integrated structure" mentioned herein refers to that the specific patterns in the layer structure formed may be continuous and not broken.

For example, materials of the first touch unit 22 and the second touch electrode 231 may be conductive materials with high light transmittance. In this way, it may be possible to prevent the first touch unit 22 and the second touch electrode 231 from adversely affecting the light-emitting effect of the display panel 100.

For example, the materials of the first touch unit 22 and the second touch electrode 231 may be indium tin oxide (ITO), indium zinc oxide (IZO) or indium gallium zinc oxide (IGZO).

For example, the plurality of conductive pins 21, the plurality of touch signal lines 24, and the conductive bridges 232 may have a same material and be disposed in a same layer. In this way, the plurality of conductive pins 21, the plurality of touch signal lines 24 and the conductive bridge 232 may be manufactured simultaneously in one patterning process, which is beneficial to simplify the manufacturing process of display panel 100.

For example, the materials of the plurality of conductive pins 21, the plurality of touch signal lines 24, and the conductive bridges 232 may be metal conductive materials such as gold (Au), silver (Ag), copper (Cu), or aluminum (Al). Of course, the materials of the plurality of conductive pins 21, the plurality of touch signal lines 24, and the conductive bridges 232 may also be metal oxide conductive materials such as ITO; or, the materials of the plurality of conductive pins 21 may be metal oxide conductive materials such as ITO, and the materials of the plurality of touch signal lines 24 and the conductive bridges 232 may be the metal conductive material.

Here, a corresponding relationship between the plurality of conductive pins 21 and the plurality of touch signal lines 24 includes various types, which may be selected and set according to actual needs.

For example, the plurality of conductive pins 21 and the plurality of touch signal lines 24 may be electrically connected in one-to-one correspondence. In this way, it is beneficial to avoid a situation of signal crosstalk.

For another example, each conductive pin 21 may be electrically connected to multiple touch signal lines 24. For example, one first sub-conductive pin 211 may be electrically connected with two, three or four first sub-touch signal lines 241, and one second sub-conductive pin 212 may be electrically connected with two, three, or four second sub-touch signal lines 242. In this way, it is beneficial to reduce the number of conductive pins 21, increase a distance between two adjacent conductive pins 21, and avoid the short-circuiting between two adjacent conductive pins 21.

It will be noted that, each conductive pin 21 and a touch signal line 24 electrically connected thereto may be of an integrated structure.

In some embodiments, as shown in FIGS. 8 to 10, the display panel 100 further includes a protective layer 3 disposed on a side of the touch structure 2 away from the display substrate 1.

In some examples, as shown in FIGS. 8 to 10, the protective layer 3 has an opening K. The opening K is located in the bonding region B1 and serves to expose the plurality of conductive pins 21. That is, the protective layer 3 covers the plurality of first touch units 22, the plurality of second touch units 23, and the plurality of touch signal lines 24 in the touch structure 2, and further covers ends of the conductive pins 21. In this way, the protective layer 3 may be serve to protect the touch structure 2 and prevent the touch structure 2 from being damaged.

Figure 11:
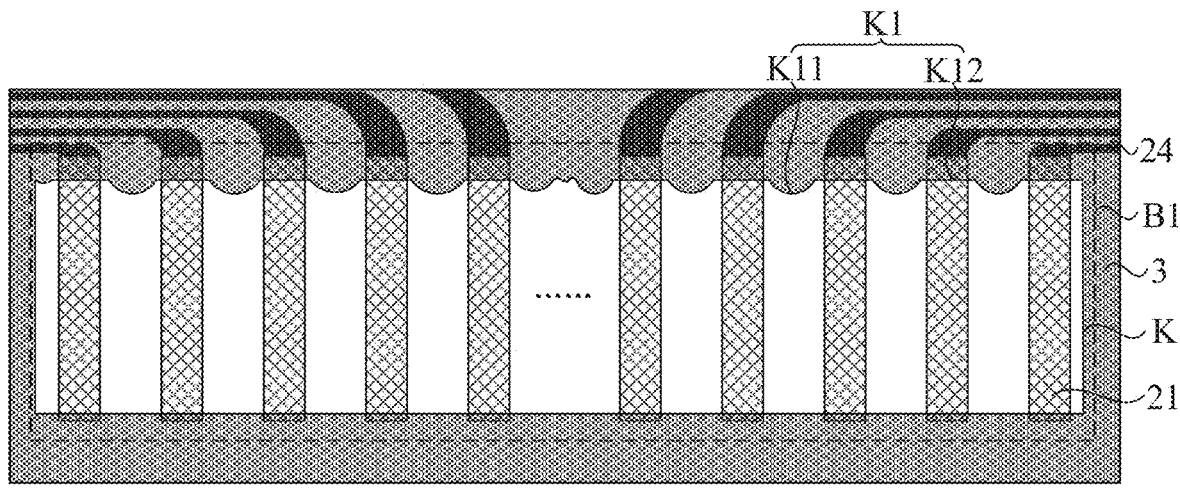
FIG. 11 is a partial enlargement view of the region E in the display panel shown in FIG. 8.
Figure 12:
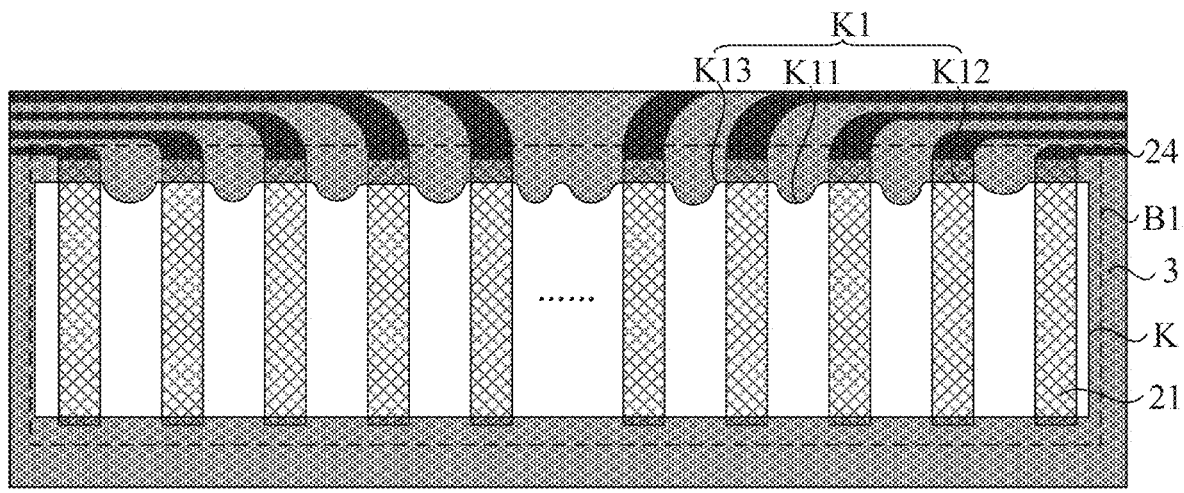
FIG. 12 is another partial enlargement view of the region E in the display panel shown in FIG. 8.

In some examples, as shown in FIGS. 8, 11, and 12, the opening K includes a border K1 proximate to the display area A and extending in an arrangement direction of the plurality of conductive pins 21 (i.e., the second direction Y), and at least portion of the border K1 has a curved shape.

The opening K may have various shapes, which may be selected and set according to actual needs, as long as at least portion of the opening K proximate to the border K1 of the display area A has the curved shape.

In a case where the display panel 100 is applied into the touch display apparatus and the touch flexible circuit board is bonded to the plurality of conductive pins 21 through the opening K, most of stress applied to the touch structure 2 by an edge of the touch flexible circuit board proximate to the display area A (a direction of the stress being a direction perpendicular to the base 11 and away from the base 11) and stress applied to the touch structure 2 by the protective layer 3 (a direction of the stress being a direction perpendicular to the base 11 and toward the base 11) will be dispersed in a portion of the touch structure 2 corresponding to the vicinity of a tip of the border K1 (i.e., the closest or farthest portion in the border K1 compared to a border of the bonding region B1), which is beneficial to reduce the stress to which the conductive pins 21 are subjected.

Therefore, in the display panel 100 provided by some embodiments of the present disclosure, the protective layer 3 is disposed on the side of the touch structure 2 away from the display substrate 1 and provided with the opening K for exposing the plurality of conductive pins 21 of the touch structure 2 therein, and in the border K1 of the opening K that is proximate to the display area A and extends in the arrangement direction of the plurality of conductive pins 21, the at least portion is arranged in the curved shape. In this way, in the case where the display panel 100 is applied into the touch display apparatus and the plurality of conductive pins 21 are bonded to the touch flexible circuit board through the opening K, compared with arranging a border of the opening as a straight-line in the implementation manner above-mentioned, it may be possible to ameliorate the dispersion situation of the stress applied to the touch structure 2 by using of the tip of the border K1 (that is, the closest or farthest portion in the border K1 compared to the border of the bonding region B1), That is, the stress applied to the touch structure 2 may be mainly dispersed in the portion corresponding to the vicinity of the tip of the border K1, which reduces stress applied to other portions. In this way, it is beneficial to reduce the stress applied to the conductive pins 21 in the touch structure 2. Furthermore, in the process of bending the touch flexible circuit board or performing a high and low temperature shock environment test on the display panel 100, it may be possible to prevent the conductive pins 21 from being broken, and to effectively avoid the failure of the sensing touch function of the display panel 100, and to improve the production yield of the display panel 100.

In addition, as a size of the frame area B of the display panel 100 decreases, a bending radius of the touch flexible circuit board will also decrease, so that a portion of the touch structure 2 corresponding to the border K1 of the opening K will be subjected to greater stress. In some embodiments of the present disclosure, the at least portion of the border K1 is arranged in the curved shape. In this way, it is beneficial to reduce the size of the frame area B of the display panel 100 while using the border K1 to effectively reduce the stress applied to the conductive pins 21. As a result, it is beneficial to achieve the narrow bezel design of the display panel 100.

It will be noted that, the border K1 of the opening K of the protective layer 3 may be arranged in various manners, which may be selected and set according to actual needs. The arrangement manner of the border K1 will be schematically described below in conjunction with the accompanying drawings.

In some embodiments, as shown in FIGS. 11 and 12, the border K1 includes a first sub-border K11 located between any two adjacent conductive pins 21. The first sub-border K11 has a curved shape, that is, a portion the border K1 located between any two adjacent conductive pins 21 has the curved shape.

By arranging the first sub-border K11 located between any two adjacent conductive pins 21 in the border K1 to have the curved shape, in the case where the display panel 100 is applied into the touch display apparatus and the plurality of conductive pins 21 are bonded to the touch flexible circuit board through the opening K, it may be ensured that most of the stress applied to the touch structure 2 is dispersed at a region between the two adjacent conductive pins 21, which effectively reduces the stress applied to the conductive pins 21. In this way, in the process of bending the touch flexible circuit board or performing the high and low temperature shock environmental test on the display panel 100, it may be possible to further prevent the conductive pins 21 from being broken. As a result, it is beneficial to further improve the production yield of the display panel 100, and the narrow bezel design of the display panel 100 may be achieved.

In some examples, as shown in FIGS. 11 and 12, a center of curvature of the first sub-border K11 is located on a side of the border K1 proximate to the display area A. That is, the first sub-border K11 may protrude in a direction in which the display area A points to the bonding region B1.

In this way, on the basis of using the protective layer 3 to cover the ends of the conductive pins 21, a covering amount of the protective layer 3 in the bonding region B1 may also be ensured, which is beneficial to ensure a good protective effect of the protective layer 3 on the touch structure 2, and avoid a situation that the touch structure 2 (e.g., the touch signal line 24 in the touch structure 2) is corroded by water vapor due to the protective layer 3 not forming a good cover on the touch structure 2.

In some examples, the curvature of each first sub-border K11 may be selected and set according to actual needs. For example, each first sub-border K11 has same or approximately same curvature.

In this way, shapes of all first sub-borders K11 may be consistent or approximately consistent. Based on this, in the case where the display panel 100 is applied into the touch display apparatus and the plurality of conductive pins 21 are bonded to the touch flexible circuit board through the opening K, it is possible to make stress applied to portions of the touch structure 2 corresponding to all first sub-borders K11 equal or approximately equal. In this way, it is beneficial to improve the uniformity of the stress dispersion, and ensure a bonding effect between the touch flexible circuit board and the touch structure 2. Moreover, in a process of forming the protective layer 3, it is also beneficial to reduce the difficulty of manufacturing the protective layer 3.

It will be noted that, the curved shape includes various shapes. For example, the curved shape includes a circular arc shape, a wave shape, a partial arc shape, or a partial wave shape.

In some examples, as shown in FIGS. 11 and 12, the first sub-border K11 may have, for example, the circular arc shape. The arc shape may be, for example, a semicircle shape, a superior arc shape, or an inferior arc shape.

In this case, a size of the first sub-border K11 may be selected and set according to actual needs, as long as most of the stress applied to the touch structure 2 may be dispersed at the region between two adjacent conductive pins 21.

For example, in a direction in which the plurality of conductive pins 21 are arranged (i.e., the second direction Y), a ratio of a dimension of each conductive pin 21 (i.e., a width of the conductive pin 21) to a radius of the first sub-border K11 is within a range of 1 to 4.67.

Optionally, the width of the conductive pin 21 may be within a range of 0.075 mm to 0.15 mm, and the radius of the first sub-border K11 may be within a range of 0.032 mm to 0.075 mm. In this way, there may be a relatively suitable distance between two adjacent conductive pins 21. As a result, it may not only avoid the short-circuiting of two adjacent conductive pins 21, but also make the bonding region B1 have a small dimension in the second direction Y.

For example, the width of the conductive pin 21 may be 0.075 mm, 0.08 mm, 0.093 mm, 0.11 mm, 0.13 mm, 010.15 mm. Accordingly, the radius of the first sub-border K11 may be 0.032 mm, 0.040 mm, 0.053 mm, 0.061 mm, 0.069 mm, or 0.075 mm.

In some embodiments, as shown in FIGS. 11 and 12, the border K may further include second sub-borders K12 overlapping with the conductive pins 21. Each second sub-borders K12 has a straight-line shape, that is, a portion of the first sub-border K1 that overlaps with each conductive pin 21 has the straight-line shape.

By arranging the shape of the second sub-border K12 overlapping with each conductive pin 21 in the border K1 to be straight-line, on a basis of using the first sub-border K11 to disperse most of the stress applied to the touch structure 2 at the region between every two adjacent conductive pins 21, it may be ensured that the rest of the stress may be evenly dispersed, so as to avoid the stress being totally concentrated at the conductive pins 21, As a result, it may be possible to further ensure an improvement effect of the stress applied to the conductive pins 21, and to further avoid the situation in which the conductive pins 21 are broken, which is beneficial to further improve the production yield of the display panel 100 to achieve the narrow bezel design of the display panel 100.

In some examples, as shown in FIGS. 11 and 12, lengths of the second sub-borders K12 are equal or approximately equal.

In this way, it may not only be possible to further reduce the difficulty of manufacturing the protective layer 3, but it may also be possible to further ensure the uniformity of dispersion of a small part of the stress dispersed in the conductive pins 21, and ensure the improvement effect of the stress applied to the conductive pins 21.

In some examples, as shown in FIG. 11, the first sub-borders K11 and the second sub-borders K12 are alternately arranged and connected in series in sequence.

In this way, it is beneficial to reduce the complexity of the shape of the border K1, thereby reducing the difficulty of manufacturing the protective layer 3.

In some embodiments, as shown in FIG. 12, the first sub-borders K11 and the second sub-borders K12 are alternately arranged. In this case, the border K1 may further include a plurality of third sub-borders K13, each third sub-border K13 connecting a respective first sub-border K11 and a second sub-border K12 that are adjacent. For example, the third sub-border K13 is located between two adjacent conductive pins 21.

In some examples, as shown in FIG. 12, the third sub-border K13 has a curved shape, and a center of curvature of the third sub-border K13 is located on a side of the border K1 away from the display area A. That is, the third sub-border K13 may protrude in a direction in which the bonding region B1 points to the display area A.

By arranging the third sub-border K13 between the first sub-border K11 and the second sub-border K12, it may be possible to make a line between the first sub-border K11 and the second sub-border K12 be smoothly transitioned, which avoids forming a tip to adversely affect the dispersion of the stress applied to the touch structure 2.

In some examples, as shown in FIG. 12, the third sub-border K13 may have a circular arc shape. The circular arc shape may be, for example, a semicircle shape, a superior arc shape, or an inferior arc shape.

In some examples, a radius of the third sub-border K13 may be within a range of 0.025 mm to 0.05 mm. In this way, it may be possible to ensure that the line between the first sub-border K11 and the second sub-border K12 may be smoothly transitioned.

For example, the radius of the third sub-border K13 may be 0.025 mm, 0.03 mm, 0.0441 mm, 0.046 mm, or 0.05 mm.

In some embodiments, as shown in FIGS. 9 and 10, the display panel 100 may further include: a base 4 disposed on a side of the touch structure 2 proximate to the display substrate 1, and a connection layer 5 connecting the display substrate 1 and the base 4. This means that the display panel 100 may be an on-cell touch display panel.

In some examples, the base 4 and the connection layer 5 may be formed of materials with a high light transmittance, so as to avoid normal light emission of the display panel 100.

For example, the base 4 may be formed of cyclo olefin polymer (COP).

For example, the connection layer 5 may be optically clear adhesive (OCA). In this case, the base 4 and the display substrate 1 may be bonded together using the OCA.

Figure 14:
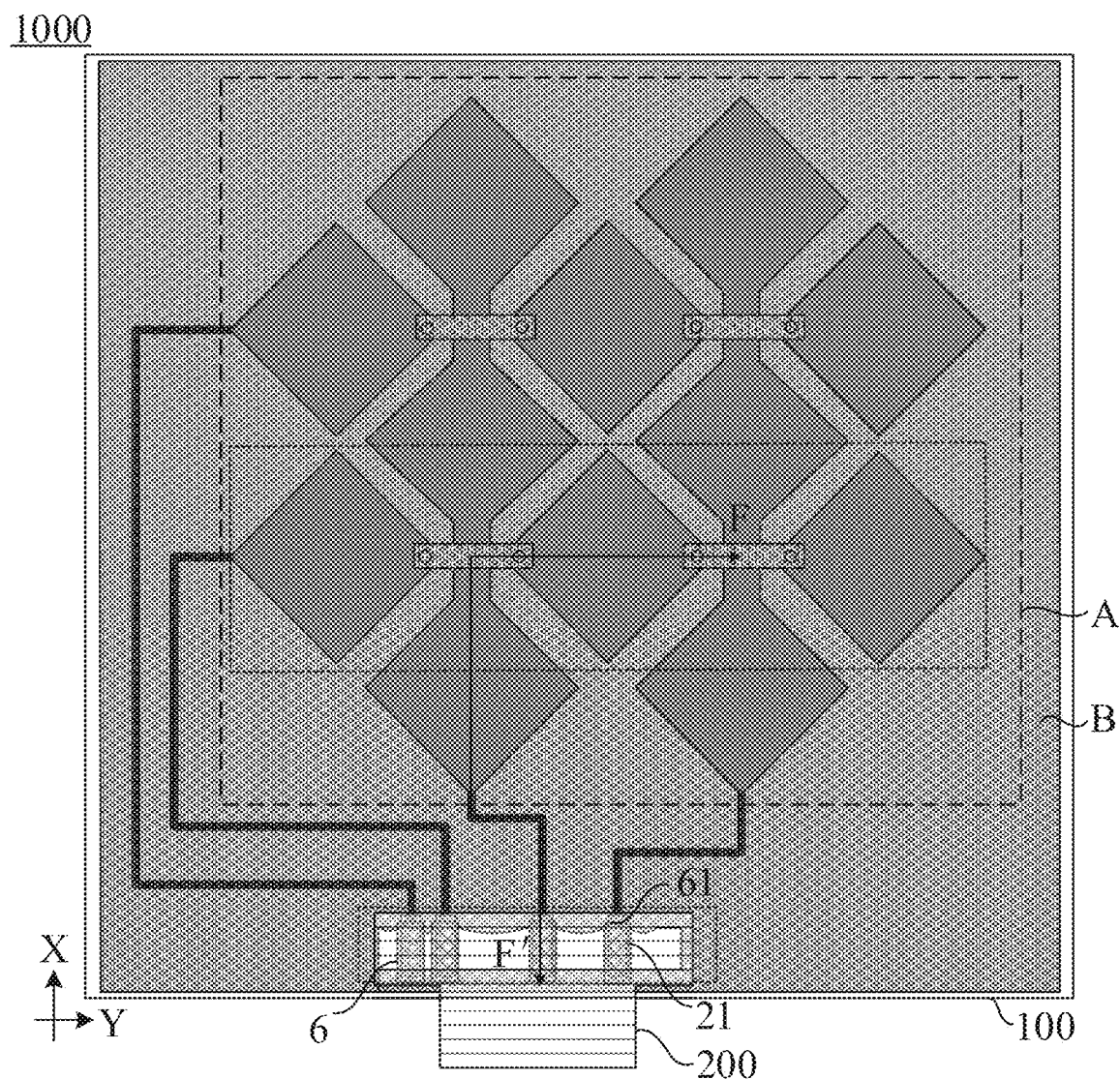
FIG. 14 is a structural diagram of a display apparatus, in accordance with some embodiments of the present disclosure.
Figure 15:
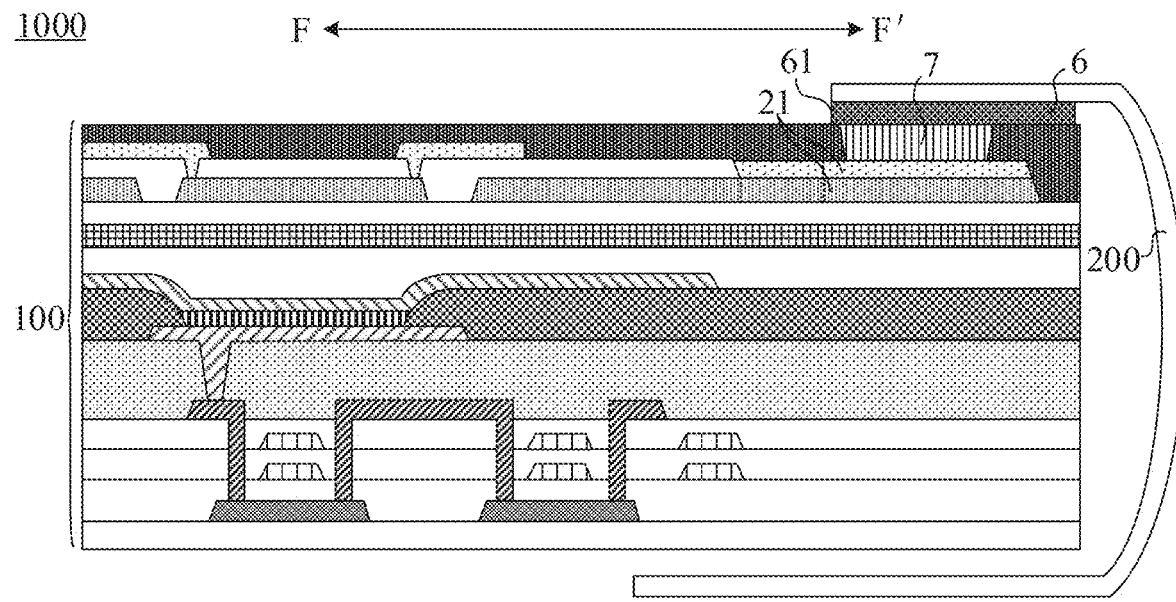
FIG. 15 is a sectional view of the display apparatus shown in FIG. 14 taken along the F-F' direction.
Figure 16:
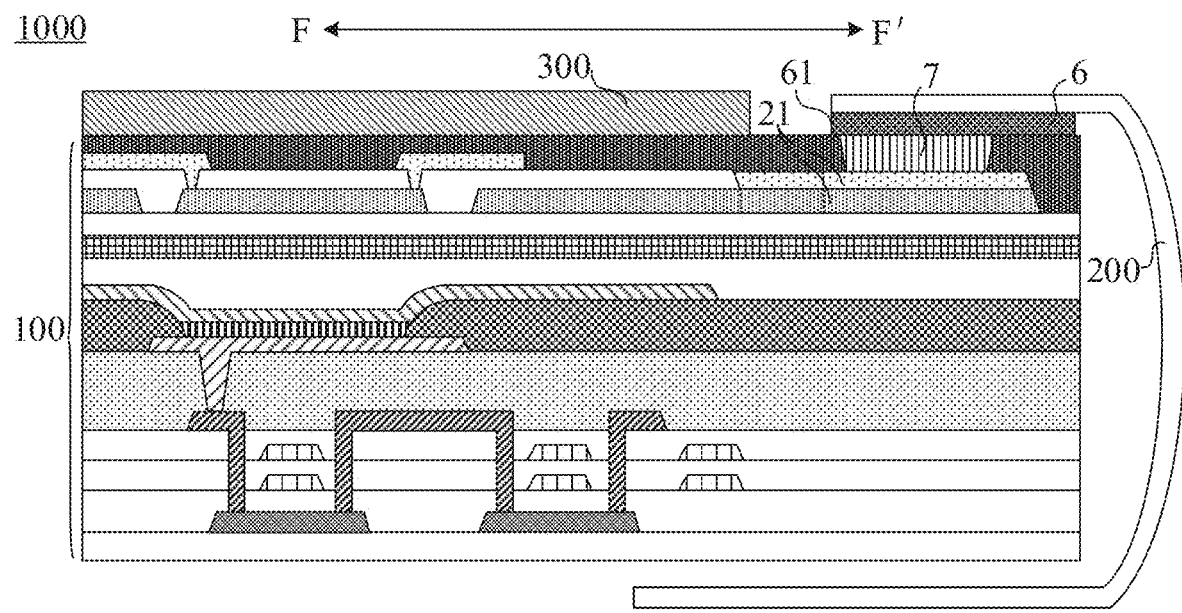
FIG. 16 is another sectional view of the display apparatus shown in FIG. 14 taken along the F-F' direction.

Some embodiments of the present disclosure provide a display apparatus 1000. As shown in FIGS. 14 to 16, the display apparatus 1000 includes: the display panel 100 and a flexible circuit board 200 bonded to the plurality of conductive pins 21 of the display panel 100. A portion of the flexible circuit board 200 is disposed on a non-light-exit side of the display panel 100 after being bent.

In some embodiments, the flexible circuit board 200 may have the same structure and function as the above-mentioned touch flexible circuit board.

In some examples, the flexible circuit board 200 may also be arranged corresponding to a plurality of bonding regions B1.

The display apparatus 1000 provided by some embodiments of the present disclosure has the same display panel 100 as in some of the above embodiments, and the beneficial effects that may be achieved are the same as the beneficial effects that can be achieved by the display panel 100, which will not be repeated here.

In some embodiments, as shown in FIGS. 15 and 16, the flexible circuit board 200 includes a plurality of gold fingers 6 bonded to the plurality of conductive pins 21. The plurality of conductive pins 21 and the plurality of gold fingers 6 may be arranged in one-to-one correspondence.

In some examples, as shown in FIG. 14, in a case where the flexible circuit board 200 is bonded to the plurality of conductive pins 21, a minimum distance between a border 61 of the plurality of add fingers 6 parallel to a direction in which the plurality of gold fingers are arranged (i.e., the second direction Y) and proximate to the display area A of the display panel 100, and the border K1 of the opening K of the protective layer 3 of the display panel 100 is within a range of 0 mm to 0.30 mm (i.e., 0.15 mm±0.15 mm).

For example, the minimum distance may be a distance between the border 61 of the gold fingers 6 and the second sub-border K12 of the border K1.

By setting the distance between the border 61 of the gold fingers 6 and the second sub-border K12 of the border K1, it may be possible to ensure that the plurality of gold fingers 6 have a large directly opposite area with corresponding conductive pins 21 within an error range of the bonding process, which may ensure that the plurality of gold fingers 6 have a large conduction area to achieve a good signal transmission effect between the gold fingers 6 and the conductive pins 21.

In some embodiments, as shown in FIGS. 15 and 16, the display apparatus 1000 may further include an anisotropic conductive adhesive (e.g., anisotropic conductive film (ACF)) 7 disposed between the plurality of conductive pins 21 and the plurality of gold fingers 6. The ACF 7 is located in the opening K of the protective layer 3.

In a process of sensing touch, the flexible circuit board 200 may transmit the driving signal to the first touch unit 22 through the gold finger 6, the ACF 7 and the conductive pin 21 in sequence, and receive the attenuated capacitance signal through the conductive pin 21, the ACF 7 and the gold finger 6 in sequence.

In some embodiments, as shown in FIG. 16, the display apparatus 1000 may further include an optical clear film (OCF) 300 disposed on a side of the protective layer 3 away from the display substrate 1. The OCF 300 has a good explosion-proof function.

Here, the OCF 300 has a high light transmittance, which may avoid adversely affecting the light emission of the display apparatus 1000.

In some embodiments, the display apparatus 1000 is any product or component having a display function, such as a mobile phone, a tablet computer, a television, a display, a notebook computer, a digital frame, or a navigator.

Figure 13:
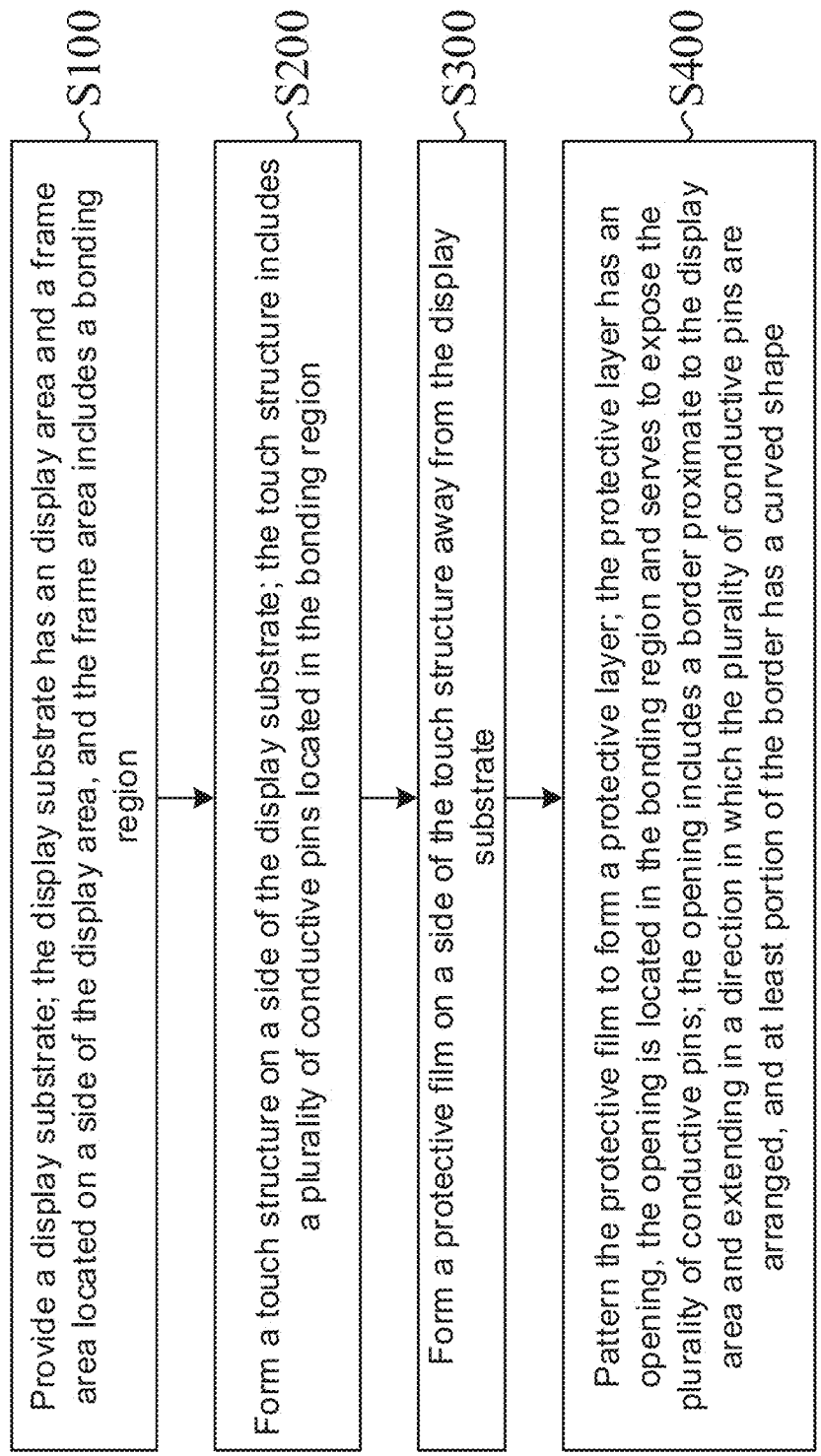
FIG. 13 is a flow diagram of a method for manufacturing a display panel, in accordance with some embodiments of the present disclosure.

Some embodiments of the present disclosure provide a method for manufacturing the display panel. As shown in FIG. 13, the manufacturing method includes S100 to S400.

In S100, a display substrate 1 is provided. The display substrate 1 has a display area A and a frame area B located on a side of the display area A, and the frame area B includes a bonding region B1.

Here, the structure of the display substrate 1 may be referred to the schematic description in some of the above embodiments, which will not be repeated here.

In S200, a touch structure 2 is formed on a light-exit side of the display substrate 1. The touch structure 2 includes a plurality of conductive pins 21 located in the bonding region B1.

In some examples, in S200, forming the touch structure 2 on the display substrate 1 may include, for example, S210 to S270.

In S210, a base 4 is provided.

For example, a division of the display area A, the frame area B, and the bonding region B1 in the display substrate 1 is the same as that of the base 4. A material of the base 4 may be the same as the material provided in some of the above embodiments.

In S220, a first conductive film is formed on a side of the base 4.

For example, the first conductive film is located in both the display area A and the frame area B.

In S230, a portion of the first conductive film located in the display area A is patterned to form a plurality of first touch units 22 and a plurality of second touch electrodes 231 of each second touch unit 23.

In S240, an insulating layer is formed on a side of the plurality of first touch units 22 and the plurality of second touch electrodes 231 of each second touch unit 23 away from the base 4. The insulating layer has a plurality of vias.

In S250, a second conductive film is formed on a side of the insulating layer away from the base 4.

For example, the second conductive film is located in the display area A and the frame area B.

In S260, a portion of the second conductive film located in the display area A is patterned to form a plurality of conductive bridges 232; and simultaneously, a portion of the second conductive film located in the frame area B and a portion of the first conductive film located in the frame area B are processed, so as to form a plurality of touch signal lines 24 located in the frame area and a plurality of conductive pins 21 zA located in the bonding region B1 to obtain the touch structure 2.

In S270, a connection layer 5 is provided to connect the base 4 and the display substrate 1 together and to make the touch structure 2 be located on a side of the base 4 away from the display substrate 1.

In S300, a protective film is formed on a side of the touch structure 2 away from the display substrate 1.

For example, a material of the protective film may be a resin material.

For example, the protective film may be formed on the side of the touch structure 2 away from the display substrate 1 by using a coating process. The protective film is located in the display area A and the frame area B to cover the touch structure.

In S400, the protective film is patterned to form a protective layer 3. The protective layer 3 has an opening K, The opening K is located in the bonding region B1 and serves to expose the plurality of conductive pins 21. The opening K includes a border K1 proximate to the display area A and extending in a direction in which the plurality of conductive pins 21 are arranged, and at least portion of the border K1 has a curved shape.

In some examples, in S400, the protective film is patterned to form the protective layer 3, which may include, for example, S410 to S440.

In S410, photoresist is coated on a side of the protective film away from the display substrate 1 to form a photoresist layer.

In S420, a mask is disposed above a side of the photoresist layer away from the display substrate 1; the photoresist is exposed, then the mask is removed; afterwards, the exposed photoresist layer is developed, and a portion corresponding to the opening to be formed is removed to obtain a patterned photoresist layer.

In S440, the protective film is patterned by using the patterned photoresist layer serving as a mask, and a portion of the protective film corresponding to the opening to be formed is removed to form the opening and to obtain the protective layer 3.

The beneficial effects that may be achieved by the method for manufacturing the display panel provided by some embodiments of the present disclosure are the same as the beneficial effects that may be achieved by the display panel 100 provided in some of the embodiments, which will not be repeated here.

The foregoing descriptions are merely specific implementations of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A display panel having a display area and a frame area located on a side of the display area, the frame area including a bonding region, the display panel comprising:
   a display substrate;
   a touch structure disposed on the display substrate, the touch structure including a plurality of conductive pins located in the bonding region;
   a protective layer disposed on a side of the touch structure away from the display substrate, the protective layer having an opening, the opening being located in the bonding region and serving to expose the plurality of conductive pins;

a base disposed on a side of the touch structure proximate to the display substrate; and a connection layer connecting the display substrate and the base; wherein the opening includes a border proximate to the display area and extending in a direction in which the plurality of conductive pins are arranged, and at least portion of the border has a curved shape.

2. The display panel according to claim 1, wherein the at least portion of the border includes a plurality of first sub-borders, each first sub-border located between respective two adjacent conductive pins and having a curved shape.

3. The display panel according to claim 2, wherein a center of curvature of the first sub-border is located on a side of the border proximate to the display area.

4. The display panel according to claim 2, wherein the first sub-border has approximately same curvature.

5. The display panel according to claim 2, wherein the curved shape of the first sub-border is a circular arc shape.

6. The display panel according to claim 5, wherein in the direction in which the plurality of conductive pins are arranged, a ratio of a dimension of each conductive pin to a radius of the first sub-border is within a range of 1 to 4.67.

7. The display panel according to claim 5, wherein a radius of the first sub-border is within a range of 0.032 mm to 0.075 mm.

8. The display panel according to claim 2, wherein the border further includes a plurality of second sub-borders, each second sub-border overlapping with a respective one of the plurality of conductive pins and having a straight-line shape.

9. The display panel according to claim 8, wherein lengths of the second sub-borders are approximately equal.

10. The display panel according to claim 8, wherein the first sub-borders and the second sub-borders are alternately arranged and connected in series.

11. The display panel according to claim 8, wherein the first sub-borders and the second sub-borders are alternately arranged; and the at least portion of the border further includes a plurality of third sub-borders, each third sub-border connecting a respective first sub-border and a second sub-border that are adjacent; wherein the third sub-border has a curved shape, and a center of curvature of the third sub-border is located on a side of the border away from the display area.

12. The display panel according to claim 11, wherein the curved shape of the third sub-border is a circular arc shape.

13. The display panel according to claim 12, wherein a radius of the third sub-border is within a range of 0.025 mm to 0.05 mm.

14. The display panel according to claim 1, wherein the plurality of conductive pins include a plurality of first sub-conductive pins and a plurality of second sub-conductive pins; and the touch structure further includes:

a plurality of first touch units located in the display area and extending in a first direction;

a plurality of second touch units located in the display area and extending in a second direction intersecting with the first direction; and a plurality of touch signal lines located in the frame area; wherein the plurality of touch signal lines include a plurality of first sub-touch signal lines and a plurality of second sub-touch signal lines, the plurality of first touch units are electrically connected with the plurality of first sub-conductive pins through the plurality of first sub-touch signal lines, and the plurality of second touch units are electrically connected with the plurality of second sub-conductive pins through the plurality of second sub-touch signal lines.

15. A display apparatus, comprising:

the display panel according to claim 1; and a flexible circuit board bonded with the plurality of conductive pins of the display panel.

16. The display apparatus according to claim 15, wherein the flexible circuit board includes a plurality of gold fingers bonded to the plurality of conductive pins; wherein a minimum distance between a border of the plurality of gold fingers parallel to a direction in which the plurality of gold fingers are arranged and proximate to the display area of the display panel and the border of the opening of the protective layer of the display panel is within a range of 0 mm to 0.30 mm.

17. A method for manufacturing a display panel, comprising:

providing a display substrate; the display substrate having a display area and a frame area located on a side of the display area, and the frame area including a bonding region;

forming a touch structure on the display substrate, the touch structure including a plurality of conductive pins located in the bonding region;

forming a protective film on a side of the touch structure away from the display substrate; and patterning the protective film to form a protective layer; wherein the protective layer has an opening, the opening is located in the bonding region and serves to expose the plurality of conductive pins, and the opening includes a border proximate to the display area and extending in a direction in which the plurality of conductive pins are arranged, and at least portion of the border has a curved shape; wherein forming the touch structure on the display substrate comprises:

providing a base;

forming a first conductive film on a side of the base;

patterning a portion of the first conductive film located in the display area to form a plurality of first touch units and a plurality of second touch electrodes of each second touch unit;

forming an insulating layer on a side of the plurality of first touch units and the plurality of second touch electrodes of each second touch unit away from the base;

forming a second conductive film on a side of the insulating layer away from the base;

patterning a portion of the second conductive film located in the display area to form a plurality of conductive bridges, processing a portion of the second conductive film located in the frame area and a portion of the first conductive film located in the frame area, so as to form a plurality of touch signal lines located in the frame area and the plurality of conductive pins located in the bonding region to obtain the touch structure; and providing a connection layer to connect the base and the display substrate together and to make the touch structure be located on a side of the base away from the display substrate.

* * * * *